(12) United States Patent
Laflaquière et al.

(10) Patent No.: US 11,381,060 B2
(45) Date of Patent: Jul. 5, 2022

(54) VCSELS WITH IMPROVED OPTICAL AND ELECTRICAL CONFINEMENT

(71) Applicant: APPLE INC., Cupertino, CA (US)

(72) Inventors: Arnaud Laflaquière, Singapore (SG); Marc Drader, Waterloo (CA); Christophe Vérove, Le Cheylas (FR)

(73) Assignee: APPLE INC., Cupertino, CA (US)

( * ) Notice: Subject to any disclaimer, the term of this patent is extended or adjusted under 35 U.S.C. 154(b) by 610 days.

(21) Appl. No.: 15/841,345

(22) Filed: Dec. 14, 2017

(65) Prior Publication Data

US 2018/0287345 A1 Oct. 4, 2018

Related U.S. Application Data

(60) Provisional application No. 62/481,139, filed on Apr. 4, 2017.

(51) Int. Cl.
*H01S 5/183* (2006.01)
*H01S 5/028* (2006.01)
(Continued)

(52) U.S. Cl.
CPC .......... *H01S 5/18308* (2013.01); *H01S 5/028* (2013.01); *H01S 5/18313* (2013.01); *H01S 5/18316* (2013.01); *H01S 5/18322* (2013.01); *H01S 5/18327* (2013.01); *H01S 5/18344* (2013.01); *H01S 5/221* (2013.01);
(Continued)

(58) Field of Classification Search
CPC ............. H01S 5/18327; H01S 5/18308–18316
See application file for complete search history.

(56) References Cited

U.S. PATENT DOCUMENTS 5,500,540 A 3/1996 Jewell et al.
5,867,513 A 2/1999 Sato
(Continued)

FOREIGN PATENT DOCUMENTS

CN 1585217 A 2/2005
CN 1632958 A 6/2005
(Continued)

OTHER PUBLICATIONS

NSM Archive—Physical Properties of Semiconductors, available at www.matprop.ru, retrieved Jan. 26, 2021 (2 pages).*
(Continued)

*Primary Examiner* — Joshua King
(74) *Attorney, Agent, or Firm* — Kligler & Associates Patent Attorneys Ltd

(57) ABSTRACT

An optoelectronic device includes a semiconductor substrate with a first set of epitaxial layers formed on an area of the substrate defining a lower distributed Bragg-reflector (DBR) stack. A second set of epitaxial layers formed over the first set defines a quantum well structure, and a third set of epitaxial layers, formed over the second set, defines an upper DBR stack. At least the third set of epitaxial layers is contained in a mesa having sides that are perpendicular to the epitaxial layers. A dielectric coating extends over the sides of at least a part of the mesa that contains the third set of epitaxial layers. Electrodes are coupled to the epitaxial layers so as to apply an excitation current to the quantum well structure.

9 Claims, 8 Drawing Sheets

(51) Int. Cl.
*H01S 5/22* (2006.01)
*H01S 5/343* (2006.01)
*H01S 5/20* (2006.01)
*H01S 5/042* (2006.01)

(52) U.S. Cl.
CPC ...... *H01S 5/34313* (2013.01); *H01S 5/34353* (2013.01); *H01S 5/04254* (2019.08); *H01S 5/2081* (2013.01); *H01S 2301/176* (2013.01)

(56) References Cited

U.S. PATENT DOCUMENTS

| | | | | |
|---|---|---|---|---|
| 6,014,400 | A * | 1/2000 | Kobayashi | B82Y 20/00 372/46.013 |
| 6,057,560 | A * | 5/2000 | Uchida | B82Y 20/00 257/94 |
| 6,201,825 | B1 | 3/2001 | Sakuria et al. | |
| 6,317,446 | B1 * | 11/2001 | Wipiejewski | H01S 5/18313 372/46.01 |
| 6,327,287 | B1 | 12/2001 | Kner et al. | |
| 6,455,340 | B1 | 9/2002 | Chua et al. | |
| 6,583,445 | B1 | 6/2003 | Reedy et al. | |
| 6,798,806 | B1 | 9/2004 | Johnson et al. | |
| 7,215,692 | B2 * | 5/2007 | Jewell | G02B 3/00 257/E33.069 |
| 7,415,055 | B2 | 8/2008 | Deng et al. | |
| 8,520,114 | B2 | 8/2013 | Cok et al. | |
| 9,038,883 | B2 | 5/2015 | Wang et al. | |
| 9,157,790 | B2 | 10/2015 | Shpunt et al. | |
| 9,389,069 | B2 | 7/2016 | Bloom et al. | |
| 9,742,153 | B1 | 8/2017 | Barve et al. | |
| 2002/0042187 | A1 | 4/2002 | Trezza et al. | |
| 2002/0075922 | A1 * | 6/2002 | Yoo | B82Y 20/00 372/45.013 |
| 2003/0169795 | A1 * | 9/2003 | Otoma | B82Y 20/00 372/46.013 |
| 2003/0194168 | A1 | 10/2003 | Ouchi | |
| 2004/0099857 | A1 * | 5/2004 | Song | H01L 33/145 257/12 |
| 2004/0120376 | A1 * | 6/2004 | Kwak | H01S 5/18311 372/46.013 |
| 2004/0241892 | A1 | 12/2004 | Colgan et al. | |
| 2005/0169343 | A1 * | 8/2005 | Ostermann | H01S 5/18355 372/98 |
| 2005/0189551 | A1 | 9/2005 | Peng et al. | |
| 2006/0002444 | A1 | 1/2006 | Wang et al. | |
| 2006/0013276 | A1 * | 1/2006 | McHugo | H01S 5/1835 372/50.124 |
| 2006/0033114 | A1 | 2/2006 | Schranz | |
| 2006/0227836 | A1 | 10/2006 | Omori et al. | |
| 2007/0041411 | A1 | 2/2007 | Pallec et al. | |
| 2007/0091961 | A1 * | 4/2007 | Lin | H01S 5/18313 372/50.124 |
| 2007/0120206 | A1 * | 5/2007 | Song | H01L 33/145 257/414 |
| 2009/0032908 | A1 * | 2/2009 | Masui | H01L 22/12 257/623 |
| 2009/0161713 | A1 | 6/2009 | Duggan et al. | |
| 2010/0029027 | A1 | 2/2010 | Ikuta et al. | |
| 2010/0203660 | A1 | 8/2010 | Tanaka | |
| 2010/0208764 | A1 | 8/2010 | Otoma et al. | |
| 2011/0182314 | A1 * | 7/2011 | Yoshikawa | H01S 5/18338 372/46.012 |
| 2013/0038881 | A1 | 2/2013 | Pesach et al. | |
| 2013/0075761 | A1 | 3/2013 | Akiyama | |
| 2013/0156060 | A1 | 6/2013 | Futagawa et al. | |
| 2013/0216247 | A1 | 8/2013 | Oba et al. | |
| 2013/0285115 | A1 | 10/2013 | Wei et al. | |
| 2013/0286614 | A1 | 10/2013 | Tan et al. | |
| 2014/0211215 | A1 | 7/2014 | Pesach et al. | |
| 2015/0255955 | A1 * | 9/2015 | Wang | H01S 5/0224 438/29 |
| 2015/0333047 | A1 | 11/2015 | Pfeuffer | |
| 2015/0340841 | A1 | 11/2015 | Joseph | |
| 2016/0377414 | A1 | 12/2016 | Thuries et al. | |
| 2017/0005455 | A1 | 1/2017 | Padullaparth | |
| 2017/0256914 | A1 | 9/2017 | Hsu et al. | |
| 2017/0353012 | A1 | 12/2017 | Barve et al. | |
| 2018/0122785 | A1 | 5/2018 | Fiorentino et al. | |
| 2018/0241177 | A1 | 8/2018 | Wong et al. | |
| 2019/0164946 | A1 | 5/2019 | Fu et al. | |
| 2019/0305522 | A1 | 10/2019 | Yuen et al. | |
| 2019/0346641 | A1 | 11/2019 | Schlepple et al. | |
| 2020/0106245 | A1 | 4/2020 | Barve et al. | |

FOREIGN PATENT DOCUMENTS

| | | | |
|---|---|---|---|
| CN | 101026211 A | 8/2007 | |
| CN | 101841129 A | 9/2010 | |
| CN | 103050063 A | 4/2013 | |
| EP | 0773614 A1 * | 5/1997 | ......... H01S 5/18316 |
| EP | 0887193 A1 | 12/1998 | |
| EP | 0896405 A2 | 2/1999 | |
| EP | 0949728 A1 | 10/1999 | |
| EP | 1418631 A2 | 5/2004 | |
| EP | 1533876 A2 * | 5/2005 | ......... H01S 5/18355 |
| JP | H09223848 A | 8/1997 | |
| JP | H11168263 A | 6/1999 | |
| JP | 2001068795 A | 3/2001 | |
| JP | 3236774 B2 | 12/2001 | |
| JP | 2003121611 A | 4/2003 | |
| JP | 2005159071 A | 6/2005 | |
| JP | 2006302981 A | 11/2006 | |
| KR | 20140061117 A | 5/2014 | |
| WO | 0245223 A1 | 6/2002 | |
| WO | WO-2006003011 A1 * | 1/2006 | ......... H01S 5/02461 |
| WO | 2007027196 A2 | 3/2007 | |
| WO | 2016122927 A1 | 8/2016 | |
| WO | 2019036383 A1 | 2/2019 | |

OTHER PUBLICATIONS

NSM Archive—Optical Properties of Semiconductors, available at www.matprop.ru, retrieved Jan. 26, 2021 (2 pages).*
International application # PCT/US2018/013230 search report dated Apr. 6, 2018.
Talghader., "Integration of LEDs and VCSELs using fluidic self-assembly", SPIE Proceedings, vol. 3286, pp. 86-95, Jan. 28, 1998.
International application # PCT/US2018/021899 search report dated Jul. 5, 2018.
Choquette et al., "Advances in Selective Wet Oxidation of AlGaAs Alloys", IEEE Journal of Selected Topics in Quantum Electronics, vol. 3, Issue 3, pp. 916-926, Jun. 1997.
Kumar et al., "Sacrificial etching of AlxGa1-xAs for III-V Mems Surface micromachining", Applied Physics A: Materials Science & Processing , vol. 88, Issue 4, pp. 711-714, Sep. 2007.
Kim et al., "Lateral wet oxidation of AlxGa1-xAs-GaAs depending on its structure", Applied Physics Letters 69, pp. 3357-3359, year 1996.
Pu et al.: "Hybrid Integration of VCSEL's to CMOS Integrated Circuits", IEEE Journal of Selected Topics in Quantum Electronics, vol. 5, No. 2, pp. 201-208, Mar./Apr. 1999.
Neff et al., "VCSEL/CMOS smart pixel arrays for free-space optical interconnects", Proceedings of the Third International Conference on Massively Parallel Processing Using Optical Interconnections,, pp. 282-289, Oct. 27-29, 1996.
Matsuo et al., "Novel technology for hybrid integration of photonic and electronic circuits", IEEE Photonics Technology Letters, vol. 8, Issue 11, pp. 1507-1509, Nov. 1996.
Liu, Y., "Heterogeneous Integration of OE Arrays With Si Electronics and Micro-optics", IEEE Transactions of Advanced Packaging, vol. 25, No. 1, pp. 43-49, Feb. 2002.
Lin et al., "Ultra-compact, high-yield intra-cavity contacts for GaAs/AlGaAs-based vertical-cavity surface-emitting lasers", Journal of Vacuum Science & Technology B, Nanotechnology and Microelectronics: Materials Processing, Measurement, and Phenomena, vol. 31, Section 1, pp. 011205-1-011205-6, Jan./Feb. 2013.
Sanchez et al., "Single-Mode Monolithic GaSB Vertical Cavity Surface-Emitting Laser", Optics Express, vol. 20, Issue 14, pp. 15540-15546, 2012.

(56) References Cited

OTHER PUBLICATIONS

CN Utility Model Patent # 201820454912.X Evaluation Report dated Mar. 22, 2019.
EP Application # 17772843.3 Office Action dated Nov. 4, 2020.
CN Application # 201880007030.1 office action dated Jun. 3, 2020.
International Application # PCT/US2020/21631 search report dated Jun. 16, 2020.
U.S. Appl. No. 16/477,205 office action dated Jun. 25, 2020.
JP Application # 2019-515351 office action dated Feb. 10, 2020.
Chinese Application # 201810285301.1 office action dated Nov. 15, 2019.
CN Application # 201780057434.7 Office Action dated Dec. 11, 2020.
NSM Archive, "Aluminium Gallium Arsenide—Optical Properties", pp. 1-2, Aug. 12, 2016.
NSM Archive, "Physical Properties of Semiconductors", p. 1, Aug. 23, 2016.
JP Application # 2020159986 Office Action dated Nov. 8, 2021.
U.S. Appl. No. 16/331,991 Office Action dated Nov. 29, 2021.
U.S. Appl. No. 16/792,317 Office Action dated Dec. 7, 2021.
U.S. Appl. No. 16/812,411 Office Action dated Jan. 19, 2022.
Ohiso et al., "Buried-heterostructure long-wavelength vertical-cavity surface-emitting lasers with InGaAsP/InP-GaAs/A1As DBRs," Electronics Letters, IEE 2000, vol. 36, No. 1, pp. 39-40, Jan. 6, 2000.
International Application # PCT/US2021/026939 Search Report dated Aug. 17, 2021.
U.S. Appl. No. 17/031,955 Office Action dated Sep. 14, 2021.
AU Application # 2021103713 Office Action dated Sep. 20, 2021.
Yeh et al., "Integration of GaAs vertical-cavity surface-emitting laser on Si by substrate removal," Applied Physics Letters, vol. 64, No. 12, pp. 1466-1467, Mar. 21, 1994.
U.S. Appl. No. 16/331,991 Office Action dated Oct. 7, 2021.
CN Application # 2017800574347 Office Action dated Oct. 19, 2021.
EP Application # 17772843.3 Office Action dated Apr. 7, 2022.
U.S. Appl. No. 16/812,411 Office Action dated Apr. 12, 2022.
U.S. Appl. No. 16/331,991 Office Action dated Apr. 15, 2022.
JP Application # 2020159986 Office Action dated May 16, 2022.

\* cited by examiner

VCSELS WITH IMPROVED OPTICAL AND ELECTRICAL CONFINEMENT

CROSS-REFERENCE TO RELATED APPLICATION

This application claims the benefit of U.S. Provisional Patent Application 62/481,139, filed Apr. 4, 2017, which is incorporated herein by reference.

FIELD OF THE INVENTION

The present invention relates generally to semiconductor devices, and particularly to optoelectronic devices and their manufacture.

BACKGROUND

VCSELs (vertical-cavity surface-emitting lasers) are semiconductor lasers, wherein the highly directional laser radiation is emitted from the top or bottom of the laser in a direction perpendicular to the substrate. VCSELs are manufactured either as single lasers or as laser arrays, and they are capable of high emission powers.

SUMMARY

Embodiments of the present invention that are described hereinbelow provide improved methods for manufacturing VCSELs, as well as VCSELs produced by such methods.

There is therefore provided, in accordance with an embodiment of the invention, an optoelectronic device, including a semiconductor substrate and a first set of epitaxial layers formed on an area of the substrate defining a lower distributed Bragg-reflector (DBR) stack. A second set of epitaxial layers is formed over the first set, defining a quantum well structure, and a third set of epitaxial layers is formed over the second set, defining an upper DBR stack. At least the third set of epitaxial layers is contained in a mesa having sides that are perpendicular to the epitaxial layers. A dielectric coating extends over the sides of at least a part of the mesa that contains the third set of epitaxial layers. Electrodes are coupled to the epitaxial layers so as to apply an excitation current to the quantum well structure.

In some embodiments, the dielectric coating does not extend over an upper surface of the mesa.

Additionally or alternatively, the device includes a confinement layer formed within the third set of epitaxial layers. The confinement layer includes a central part including a semiconducting material and a peripheral part surrounding the central part and including a dielectric material. In one embodiment, the dielectric coating extends from an upper surface of the mesa down to the confinement layer. Additionally or alternatively, the semiconductor material includes $Al_xGa_{1-x}As$, wherein x does not exceed 0.92. Further additionally or alternatively, the thickness of the confinement layer exceeds 50 nm. In the disclosed embodiments, the refractive index of the dielectric material does not exceed 1.6. In one embodiment, the dielectric material includes silicon dioxide ($SiO_2$). In another amendment, the peripheral part includes a sealed cavity.

There is also provided, in accordance with an embodiment of the invention, an optoelectronic device, including a semiconductor substrate and a first set of epitaxial layers formed on an area of the substrate defining a lower distributed Bragg-reflector (DBR) stack. A second set of epitaxial layers is formed over the first set, defining a quantum well structure, and a third set of epitaxial layers is formed over the second set, defining an upper DBR stack. A confinement layer is formed within the third set of epitaxial layers, and includes a central part contained under the mesa and including a semiconducting material, and a peripheral part surrounding the central part and including a dielectric material having a refractive index that does not exceed 1.6. Electrodes are coupled to the epitaxial layers so as to apply an excitation current to the quantum well structure.

There is additionally provided, in accordance with an embodiment of the invention, a method for manufacturing an optoelectronic device. The method includes depositing a first set of epitaxial layers on an area of a semiconductor substrate to define a lower distributed Bragg-reflector (DBR) stack. A second set of epitaxial layers is deposited over the first set, defining a quantum well structure. A third set of epitaxial layers is deposited over the second set, defining an upper DBR stack, and including a confinement layer, including a semiconductor material, within the upper DBR stack. The third set of epitaxial layers is etched to define a mesa having sides that are perpendicular to the epitaxial layers and extend from an upper surface of the upper DBR stack down to the confinement layer. The sides of the mesa are coated with a dielectric coating. After coating the sides of the mesa, the confinement layer is processed so as to convert a peripheral part of the confinement layer to a dielectric material, while leaving the semiconductor material in a central part of the confinement layer, surrounded by the peripheral part. Electrodes are coupled to the epitaxial layers so as to apply an excitation current to the quantum well structure.

In a disclosed embodiment, converting the peripheral part includes etching the peripheral part so as to form a cavity under the mesa, and applying a conformal coating of a dielectric material to the cavity.

In another embodiment, converting the peripheral part includes etching the peripheral part so as to form a cavity under the mesa, and applying a non-conformal coating of a dielectric material to the optoelectronic device so as to seal the entrance of the cavity with the dielectric material leaving the cavity filled with the gas.

The present invention will be more fully understood from the following detailed description of the embodiments thereof, taken together with the drawings in which:

DETAILED DESCRIPTION OF EMBODIMENTS

Overview

Figure 1:
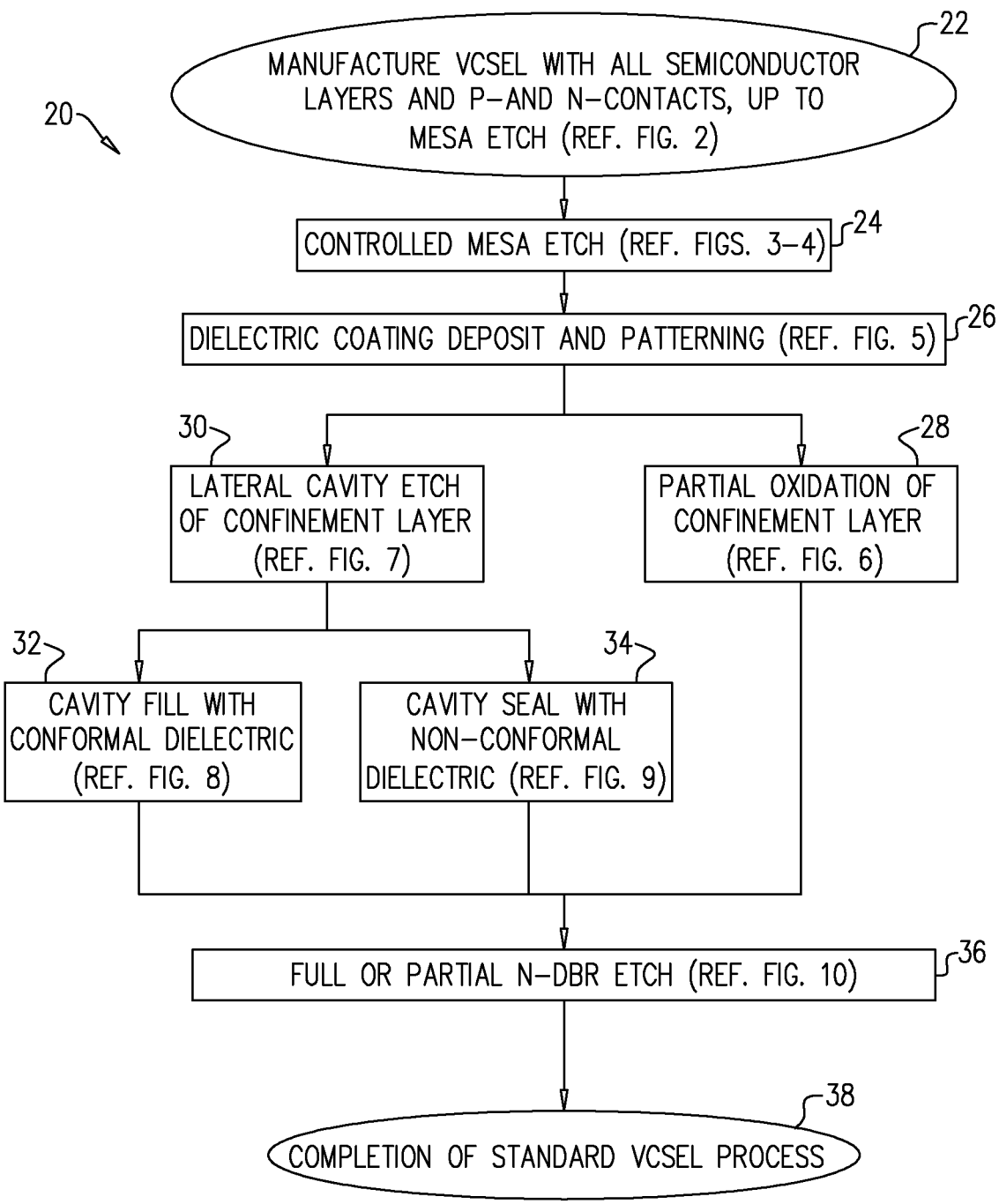
FIG. 1 is a flowchart that schematically illustrates methods for fabricating VCSELs, in accordance with an embodiment of the invention.

A VCSEL (vertical-cavity surface-emitting laser) typically comprises an n-type GaAs substrate, onto which an n-DBR stack is deposited. n-DBR refers to a distributed Bragg-reflector comprising repetitive n-type pairs of AlGaAs layers, wherein one of the layers of the pair has a low Al-content and the other layer has a high Al-content. The thickness of each layer is a quarter of the local wavelength of the light emitted by the VCSEL. Next, a QW (quantum well) stack is deposited on the n-DBR stack. A QW stack comprises, for example, one or more InGaAs layers separated by GaAs barriers, and surrounded on both sides by AlGaAs confinement layers. The InGaAs layers and GaAs barriers can each be about 8 nm thick, for example, while the confinement layers are about 120 nm thick. Then a p-DBR stack (comprising several p-type quarter-wave AlGaAs-layer pairs with low and high Al-content) is deposited on the QW stack. A sheet-type ground electrode is deposited on the n-type substrate and a patterned electrode is deposited on the p-DBR stack, with an opening in the middle as an exit for the VCSEL radiation.

Advanced VCSELs employ lateral oxidation to confine both the electrical current and the optical radiation within the VCSEL. Confinement of the electrical current brings the carriers into a well-defined volume within the active area in the QW stack of the VCSEL, and the optical confinement controls in a precise manner the optical modes of the radiation generated by the VCSEL.

In a commonly used method for lateral oxidation, a very thin confinement layer (typically 30 nm thick) of AlGaAs-material with a very high molar content of aluminum (up to 98% of Al with 2% of Ga) is inserted inside the VCSEL epitaxy stack, generally inside the p-DBR stack and as close as possible to the QW stack. After etching the p-DBR stack to a mesa-like structure at least down to the confinement layer, the device is inserted in an oxidation furnace, typically in an atmosphere of $H_2O$ vapor. Because of the higher content of Al of the confinement layer, this layer will oxidize faster than the rest of the AlGaAs stack. By controlling the time and the temperature of the oxidation process step, a transparent and electrically isolating oxide layer is formed, with the oxide extending in from the mesa walls. The remaining non-oxidized area defines the optical aperture of the VCSEL, which in turn defines the waist of the Gaussian beam of the VCSEL. The optical confinement derives from the fact that the non-oxidized area has a higher refractive index than the surrounding oxide. It also constrains the current of the VCSEL into the non-oxidized area.

Although lateral VCSEL oxidation, as described above, is widely used in the manufacture of VCSELs, it poses several challenges:

1. It is difficult to control adequately the uniformity and gas flow in the oxidation furnace.
2. The oxidation process shrinks the $Al_{0.98}Ga_{0.01}As$ confinement layer, typically by 10%. In order to avoid excessive stress in the semiconductor stack of the VCSEL, the thickness of this layer should not exceed 30 nm.
3. The confinement layer, grown using typically an MOCVD (metalorganic chemical vapor deposition) process, may exhibit a thickness variation of several nanometers, which constitutes a large relative variation of the layer thickness. It may also exhibit variations in the Al-content due to the process.
4. The combination of non-uniformities of the layer thickness, Al-content, and of the process parameters (temperature and gas flow) may lead to a large variability in the lateral geometry of the non-oxidized aperture. This, in turn, leads to a large variability in important performance parameters of the VCSEL, such as its spot size and numerical aperture. The associated loss of yield in the VCSEL manufacturing process may be significant.
5. In addition to the problem of controlling the thickness of the $Al_{0.98}Ga_{0.02}As$ confinement layer, this layer is affected by process problems:
   a. It is difficult to find an operating point in the oxidation process that discriminates the confinement layer against the other layers in the p-DBR stack, as some of these layers may also have an Al-content around 90%.
   b. It is difficult to control the oxidation rate of a layer with such a high Al-content.

However, reducing the Al-content for better oxidation control would make the discrimination against the other layers in the p-DBR stack even more difficult.

The embodiments of the present invention that are described herein address the processing problems above so as to enable the generation of well-controlled isolation layers of different compositions, with reduced adverse effects on the rest of the semiconductor stack. This, in turn, enables the generation of a VCSEL optical aperture whose lateral shape and dimensions are highly controlled and accurate, leading to an increased yield of VCSELs within tight optical performance specifications.

The disclosed embodiments use a controlled etch process for etching the VCSEL mesa down to a confinement layer that will subsequently be converted to an isolation layer surrounding a central non-converted part of the confinement layer. After the etch, the mesa walls receive a protective dielectric coating, thus relaxing both the material and process constraints relating to the isolation layer. Several options for confinement layer materials and processes are described below. The controlled etch comprises switching between two etch chemistries, which have a different selectivity to the different layers of the p-DBR stack depending on their Al-content. The switching between the etch chemistries takes place in response to a signal from a process sensor, which monitors the level of one or more of the etch products (e.g. Al and/or Ga) in the etch chamber. The controlled etch enables terminating the etch either at a selected layer of the p-DBR stack or at a dedicated etch stop layer in the stack. Alternatively, the etch may be non-selective to the DBR stack layers but selective to an etch stop layer in the p-DBR stack, and is consequently terminated by the etch stop layer.

After the mesa etch, the mesa is coated with a dielectric coating, for example $SiO_2$ or $Si_3N_4$. The dielectric coating is etched by a directional dry etch, such as RIE (reactive ion etch), which removes only the horizontal parts of the dielectric coating, leaving the vertical parts to protect the sides of the mesa.

In an embodiment of the present invention, a confinement layer with a very high Al-content, such as $Al_{0.93}Ga_{0.02}As$, typically 30 nm thick, is incorporated in the p-DBR stack. By a very high Al-content we refer to a composition $Al_xGa_{1-x}As$, where x, referring to the molar content of Al, is $x>0.92$. The mesa etch is stopped at this layer. After protecting the sides of the mesa with the dielectric coating, the oxidation of the $Al_{0.93}Ga_{0.02}As$ layer is started. As the mesa is protected from the oxidation process by the coating, the oxidation of $Al_{0.93}Ga_{0.02}As$ can can proceed without worrying about the effect of the oxidation on the mesa p-DBR stack. After the oxidation has progressed inwards from the mesa walls to a desired depth, i.e. formed a desired non-oxidized aperture for optical and electrical confinement, the oxidation is terminated. The process continues with a full or partial etching of the n-DBR stack, followed by the remaining steps of a standard VCSEL manufacturing process.

In an alternative embodiment, a confinement layer $Al_xGa_{1-x}As$, where $x<0.92$, such as $Al_{0.93}Ga_{0.02}As$, is incorporated in the p-DBR stack. We refer to a confinement layer of this composition as having a high Al-content (as opposed to a very high Al-content for $x>0.92$). (Alternatively, any of the AlGaAs-layers of the p-DBR stack may be used for this purpose). As a confinement layer with high Al-content shrinks during the oxidation process less than a very high Al-content layer, it can be deposited to a thickness typically exceeding 50 nm. The thicker layer and its lower Al-content provide several advantages over a very high Al-content layer, as is detailed below. The overall process, including the protection of the VCSEL mesa, is similar to that for a very high Al-content layer.

In another embodiment, following the mesa etch described above, the confinement layer is partially removed using a wet etch, typically comprising a citric acid and/or diluted hydrofluoric acid. The etching is terminated once a cavity is formed so that the remaining non-etched layer has the lateral dimensions of the desired aperture for optical and electrical confinement. The process may continue in a number of different ways from this point onwards:

In a first embodiment the cavity is filled with dielectric material, with a refractive index below 1.6. The advantage of having a refractive index below that achievable by oxidized Al (1.76 for $Al_2O_3$) is that the lower the refractive index around the optical aperture, the better the optical confinement. An example of a dielectric cavity fill material is silicon dioxide ($SiO_2$), whose refractive index is 1.45. $SiO_2$ is typically deposited as a highly conformal coating on the cavity walls using an ALD (atomic layer deposition) process.

After the filling of the cavity is completed, the process continues with a full or partial etching of the n-DBR stack, followed by the remaining steps of a standard VCSEL manufacturing process.

In an alternative embodiment, the entrance to the cavity is sealed with a non-conformal coating of a dielectric material, such as $SiO_2$ or $Si_3N_4$. A typical process used for the non-conformal coating is PECVD (plasma-enhanced chemical vapor deposition). Due to the combination of a thin cavity and a non-conformal coating process, the dielectric material penetrates into the cavity only a very short distance before sealing its entrance, leaving most of the cavity filled with the low-pressure atmosphere (typically of the order of 0.001-1 Torr) that constitutes the ambient atmosphere during the non-conformal coating. As the refractive index of the low-pressure atmosphere is typically 1.00, it provides for even better optical confinement than a solid dielectric such as $SiO_2$. After closing the cavity, the process is followed by a full or partial etching of the n-DBR stack, followed by the remaining steps of a standard VCSEL manufacturing process.

Process Details

FIGS. 1-10 illustrate schematically methods for fabricating VCSELs, in accordance with embodiments of the invention. FIG. 1 is a schematic flowchart of the process steps and FIGS. 2 and 4-10 are schematic sectional illustrations showing the results of these steps, with FIGS. 3A-B detailing the controlled mesa etch process.

FIG. 1 is a schematic flowchart 20 of the process steps for fabricating VCSELs. Each step in flowchart 20 refers to one or more illustrations in the remaining figures. In a deposit step 22, the semiconductor layers of a VCSEL (n-DBR stack, QW stack, and p-DBR stack) are deposited on a substrate, and the n- and p-electrodes are deposited and patterned. In a mesa etch step 24, a controlled etch is performed to form a partial VCSEL mesa structure. In a coating step 26, a dielectric coating is deposited and patterned on the mesa walls. After coating step 26, the process splits into an oxidation step 28 and a cavity etch step 30, which belong to two alternative embodiments of the invention.

In oxidation step 28, a confinement layer, having a high or very high Al-content, is partially oxidized. Oxidation step 28 is followed by an n-DBR etch step 36, which comprises a full or partial etch of the n-DBR stack, followed by a VCSEL completion step 38.

In cavity etch step 30, a lateral cavity is etched into the confinement layer under the mesa of the VCSEL. After cavity etch step 30, the process splits again into a cavity fill step 32 and a cavity seal step 34, as two alternative embodiments of the invention. In cavity fill step 32, a layer of dielectric material, typically $SiO_2$, is deposited on the VCSEL using a conformal coating process, such as ALD (atomic layer deposition). Due to the conformal nature of the coating, the dielectric material, besides covering the VCSEL, completely or partially fills the cavity that was formed in cavity etch step 30. In cavity seal step 34, a layer of dielectric material, typically $SiO_2$ or $Si_3N_4$, is deposited on the VCSEL using a non-conformal coating process, such as PECVD (plasma-enhanced chemical vapor deposition). Due to the non-conformal nature of the coating, the dielectric material seals the entrance to the cavity rather than filling it. Both cavity fill step 32 and cavity seal step 34 are followed by n-DBR etch step 36 and VCSEL completion step 38.

Figure 2:
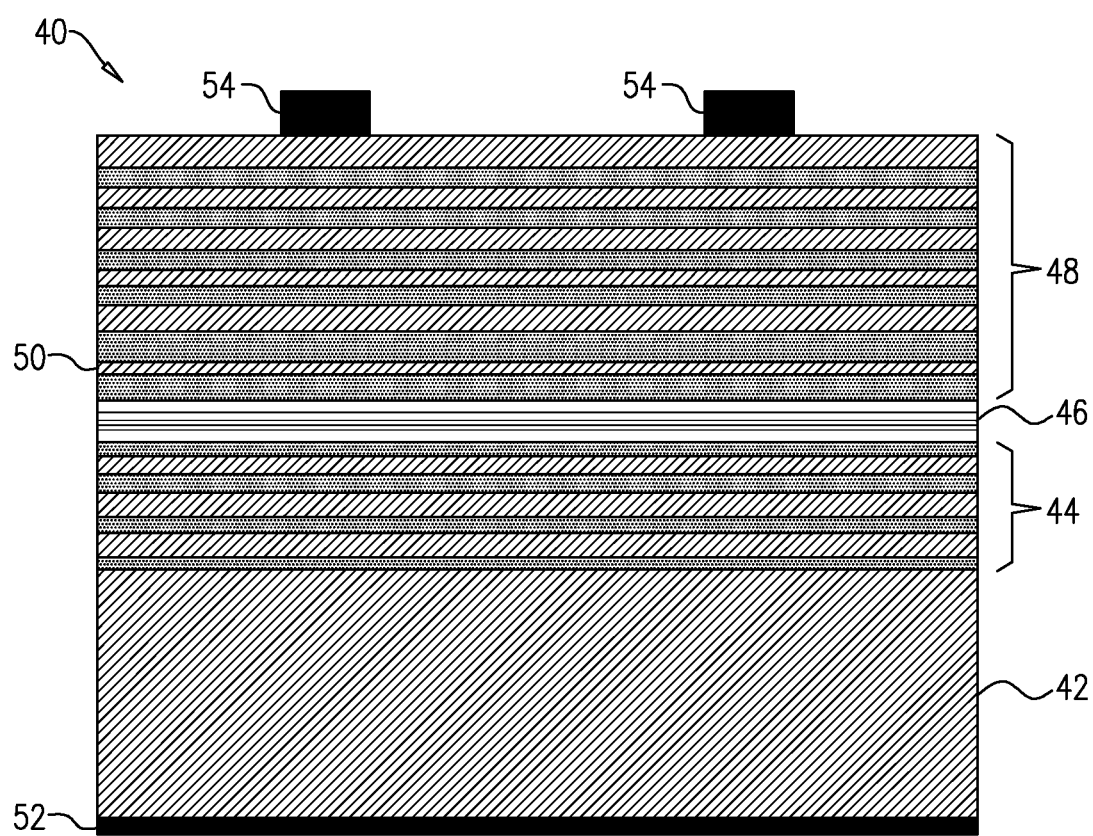
FIG. 2 is a schematic sectional illustration of a VCSEL after a deposit step, in accordance with an embodiment of the invention.

FIG. 2 is a schematic sectional illustration of a VCSEL 40 after deposit step 22. VCSEL 40 comprises a substrate 42 made of n-type GaAs semiconductor material. On substrate 42 an n-DBR stack 44 has been deposited, the stack comprising repetitive n-type pairs of AlGaAs layers, wherein one of the layers of the pair has a low Al-content and the other layer has a high Al-content. Typically, the layer of low Al-composition is of the type $Al_{0.10}Ga_{0.90}As$, and the layer of high Al-composition is of the type $Al_{0.93}Ga_{0.10}As$, although other compositions are also possible. The thickness of each layer is a quarter of the local wavelength of the light emitted by the VCSEL.

On top of n-DBR stack 44 a QW stack 46 has been deposited, comprising for example two or more 8 nm thick InGaAs layers, separated by 8 nm thick GaAs barriers and surrounded on both sides by 120 nm thick AlGaAs confinement layers. On top of QW stack 46, a p-DBR stack 48 has been deposited, comprising repetitive p-type pairs of AlGaAs quarter-wave layers, with alternating low and high Al-content.

During the deposition of p-DBR stack 48, a confinement layer 50 of AlGaAs with very high Al-content is deposited in proximity to QW stack 46. Confinement layer 50 comprises, for example, $Al_{0.98}Ga_{0.02}As$. The thickness of confinement layer 50 in this case does not typically exceed 30 nm, as the oxidation process will cause the layer to shrink by about 10%. A thickness exceeding 30 nm would, due to the shrinkage, generate unacceptable stress in the semiconductor stack.

In an alternative embodiment, confinement layer 50 comprises AlGaAs with a high Al-content, such as $Al_{0.90}Ga_{0.10}As$. Due to its lower Al-content the shrinkage of this layer during oxidation is approximately half of that of $Al_{0.98}Ga_{0.02}As$. Consequently, the layer thickness may be allowed to reach 60 nm before causing the same mechanical stress in the semiconductor stack as that caused by a 30 nm thick layer of $Al_{0.98}Ga_{0.02}As$. The advantages of the lower Al-content and higher film thickness will be detailed in the context of FIG. 6.

Alternatively, confinement layer 50 is similar in composition and thickness to the other AlGaAs-layers of p-DBR stack 48.

A ground electrode 52 has been deposited on the bottom of substrate 42, and p-electrodes 54 have been deposited and patterned on top of p-DBR stack 48.

Figures 3A, 3B:
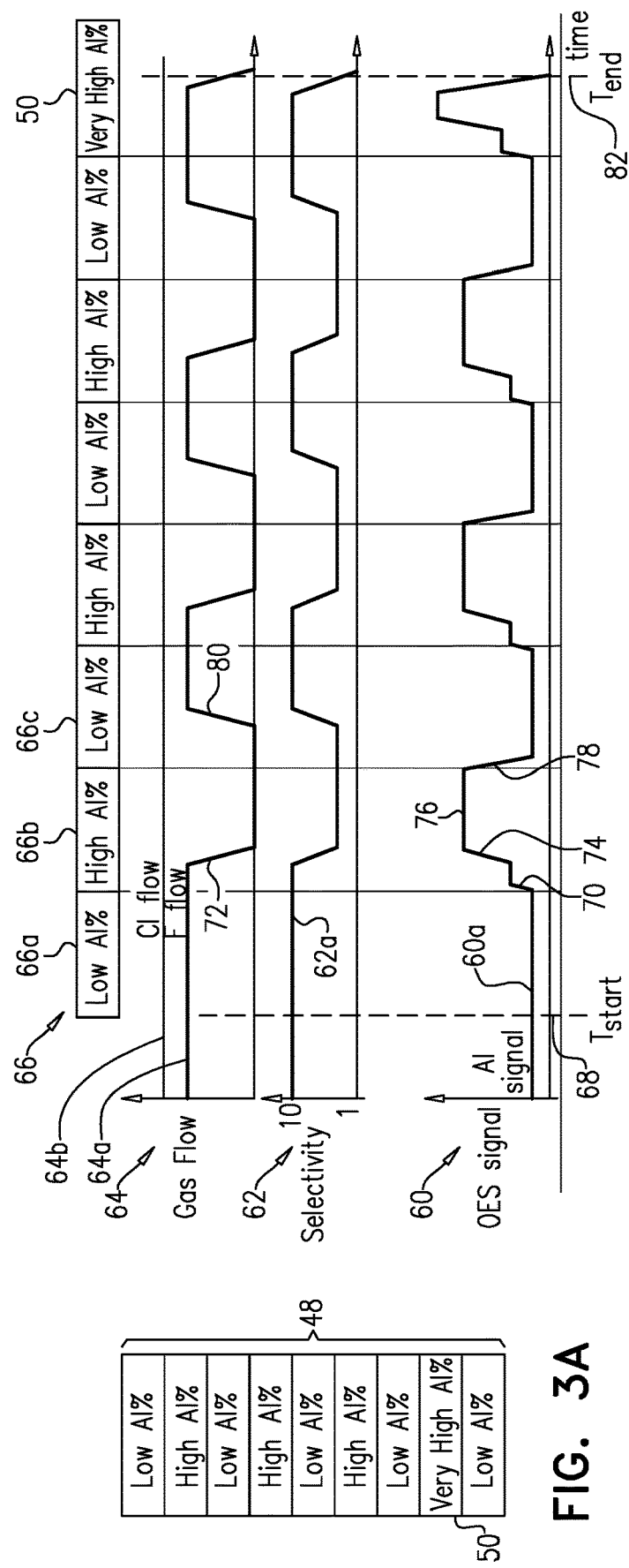
FIG. 3A is a schematic sectional illustration of a partial p-DBR stack, in accordance with an embodiment of the invention.
FIG. 3B is a plot showing process parameters of a controlled mesa etch process, in accordance with an embodiment of the invention.

FIG. 3A is a sectional illustration showing details of the layers of a partial p-DBR stack 48 with four Bragg-mirror pairs. (Each pair comprises an AlGaAs layer with low Al-content, and a layer with high Al-content). In addition, at the bottom of p-DBR stack 48 is confinement layer 50 with very high Al-content, for example $Al_{0.98}Ga_{0.02}As$, surrounded above and below by layers with low Al-content. Although only four pairs of Bragg-mirrors are illustrated in FIG. 3A, alternative embodiments may comprise many more Bragg-mirror pairs, such as 20 or 30 pairs.

FIG. 3B is a plot showing process parameters of the controlled etch process. The figure comprises three graphs showing different process parameters against a horizontal time axis: A graph 60 illustrates the level of Al in the process chamber, as measured by OES (optical emission spectroscopy). A curve 60a in graph 60 shows the level of Al. In alternative embodiments, additional or alternative levels of etch products, such as Ga, may be measured and used as process feedback. A graph 62 illustrates the etch selectivity of the etch gases in the process chamber with respect to the two layers of p-DBR stack 48. A curve 62a in graph 62 shows the selectivity, defined as the ratio of the etch rate of the low Al-content layer to the etch rate of the high Al-content layer.

Stacks with alternating Al-content, such as p-DBR stack 48, are typically etched in chlorine-based chemistries, with fluorine added to enhance the selectivity of low Al-content layer over high Al-content layer. Typical gas combinations are $BCl_3$—$SF_6$ and $SiCl_4$—$SiF_4$, with a typical selectivity of 10:1. Pure chlorine chemistries are usually non-selective between low and high Al-content layers (1:1 selectivity). A graph 64 illustrates the rate of flow of the two gases used in the controlled etch. A curve 64a in graph 64 shows the flow of a fluorine-based gas, such as $SiF_4$, $SF_6$, or $NF_3$. A curve 64b in graph 64 shows the flow of a chlorine-based gas, such as $SiCl_4$ or $BCl_3$. In order to facilitate following the vertical progress of the etch with respect to p-DBR stack 48, the stack is shown (turned by 90°) along the time axis as a block 66.

The etch starts at time $T_{start}$, marked by a line 68. As the layer etched at this time is a low Al-content layer 66a, a mixture of chlorine- and fluorine-based gases is used, as shown by curves 64b and 64a, respectively. The selectivity of this gas mixture between low and high Al-content layers is, according to a realistic estimate, 10:1, as shown by curve 62a. While low Al-content layer 66a is etched, the Al signal shown by curve 60a is low. Once the etch has removed low Al-content layer 66a and starts etching a high Al-content layer 66b, the Al signal of curve 60a starts increasing, as shown by a rising edge 70. This rising edge 70 triggers an etch controller to switch the gas mixture to chlorine-based gas only, as shown by a falling edge 72 of curve 64a. Al signal (curve 60a) continues rising, as shown by a rising edge 74, reaching a steady-state 76. This steady-state 76 continues while high Al-content layer 66b is being etched. Once the etch has removed high Al-content layer 66b and starts etching a low Al-content layer 66c, the Al signal drops as shown by a falling edge 78 of curve 60a. This falling edge 78 triggers the etch controller to add fluorine-based gas back into the etch gas mixture, as shown by a rising edge 80 of curve 64a.

The described etch progression is repeated for each pair of low and high Al-content layers, until the etch reaches confinement layer 50 with a very high Al-content. At this point, at time $T_{end}$ marked by a line 82, the etch is terminated by the etch controller. The step-by-step process of the disclosed embodiment allows a controlled termination of etch on confinement layer 50 without any additional layers in p-DBR stack 48.

The described controlled etch process may also be used to stop the etch at confinement layer 50 comprising a high Al-content layer ($Al_xGa_{1-x}As$, wherein $0.8<x<0.92$, for example) or at any other layer of p-DBR stack 48.

The inventors have performed simulations of the etch process described above using the following values of parameters:
1. A 10% non-uniformity for both the selective and non-selective etch processes;
2. A 10:1 selectivity for the selective etch process;
3. A 1:1 selectivity for the non-selective etch process; and
4. Up to 20 or 30 layer-pairs in p-DBR stack 48.

These simulations predict an acceptable overall process uniformity throughout the entire controlled etch process. An acceptable uniformity may be, for example, less than 2 nm thickness variation after etching 24 layer-pairs in p-DBR stack 48 and reaching confinement layer 50.

Figure 4:
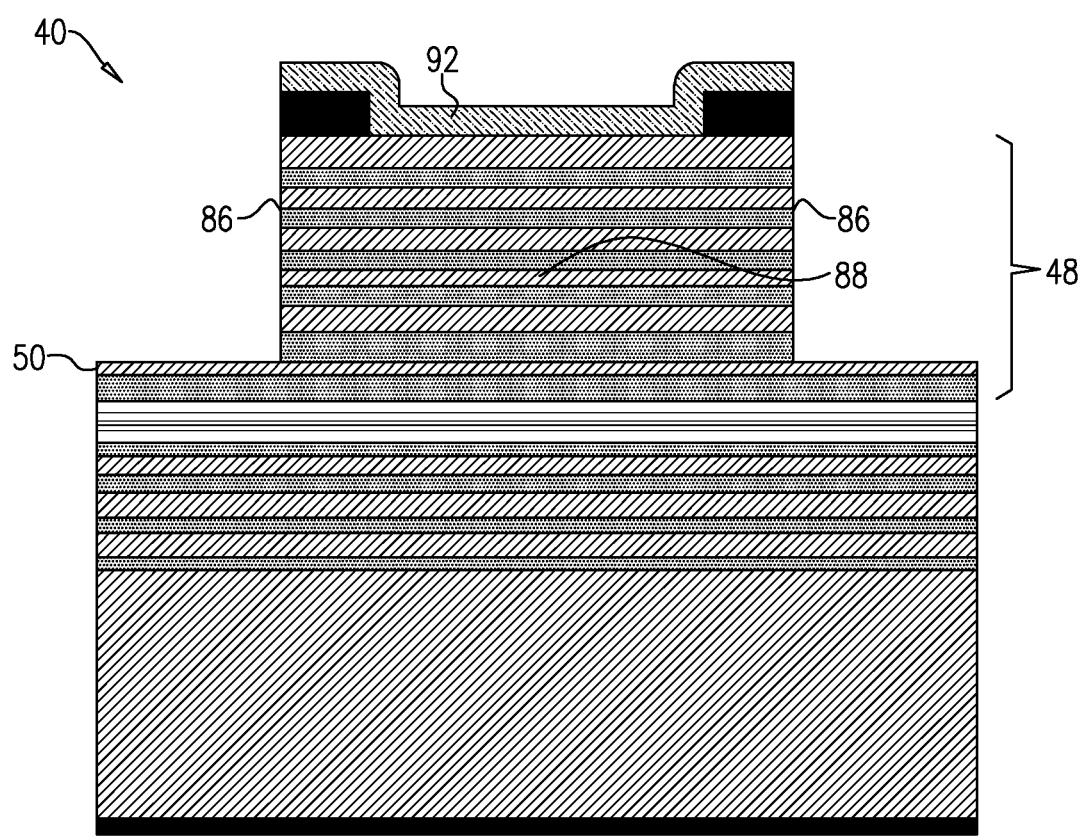
FIG. 4 is a schematic sectional illustration of a VCSEL after a mesa etch step, in accordance with an embodiment of the invention.

FIG. 4 is a schematic sectional illustration of a VCSEL 40 after mesa etch step 24, with the etch process described above in detail. Before mesa etch step 24, a hard mask 92 has been deposited and patterned to define a mesa 88 during the etch. At the stage shown in FIG. 4, p-DBR stack 48 has been etched down to confinement layer 50, forming mesa 88 with mesa walls 86.

Figure 5A:
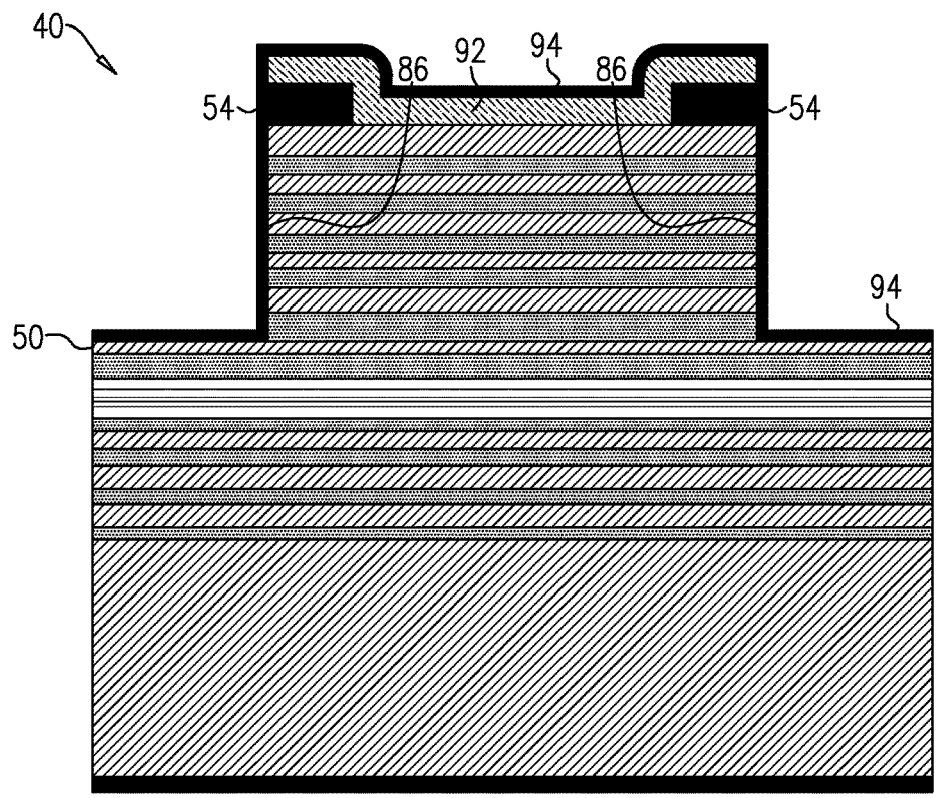
FIGS. 5A-B are schematic sectional illustrations of a VCSEL after a coating step, in accordance with an embodiment of the invention.
Figure 5B:
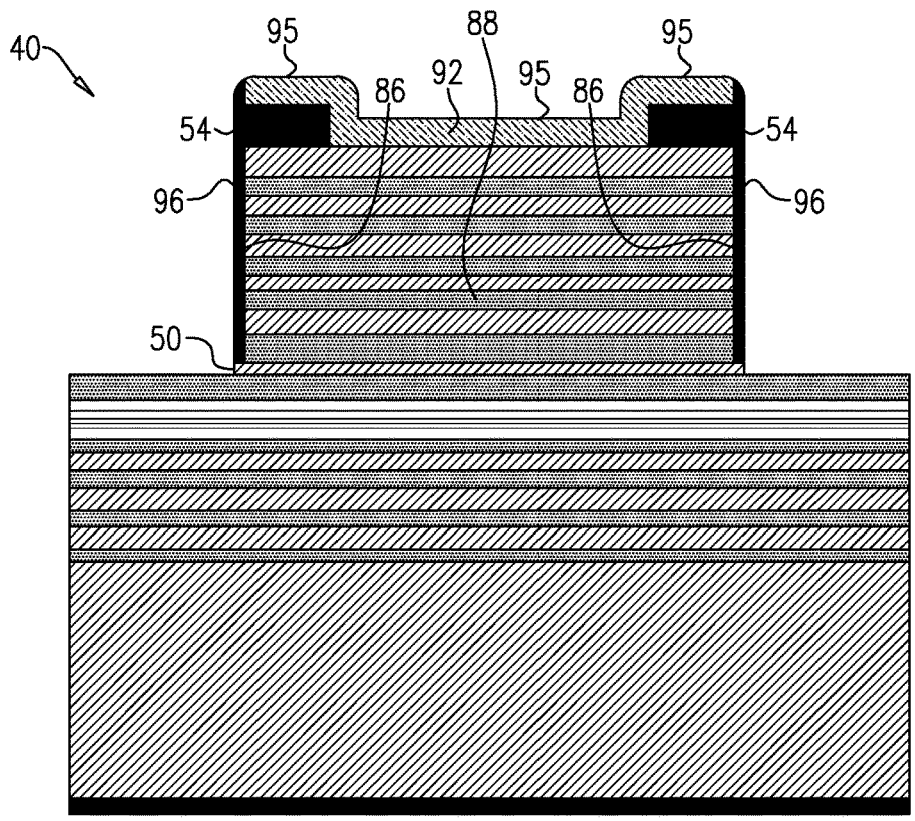

FIGS. 5A-B are schematic sectional illustrations of VCSEL 40 after depositing and depositing and patterning a dielectric coating 94 in coating step 26. An alternative terminology for "dielectric coating deposition and patterning", used in the semiconductor industry, is "dielectric spacer deposition and etching."

FIG. 5A shows VCSEL 40 after dielectric coating 94, for example $SiO_2$ or $Si_3N_4$, has been deposited over VCSEL 40.

FIG. 5B shows VCSEL 40 after RIE of dielectric coating 94. Since RIE is a very directional etch, it has removed the horizontal parts of dielectric coating 94, as well as the parts of confinement layer 50 not underneath mesa 88. As hard mask 92 remains in place after RIE and covers both p-electrodes 54 and the surface of mesa 88 between the p-electrodes, it forms an upper surface 95 of mesa 88. Dielectric coating 96, which is the part of dielectric coating 94 remaining after RIE, extends from upper surface 95 down to the level of confinement layer 50. Dielectric coating 96 will protect the layers within mesa 88 from oxidation and/or etching in the following process steps.

Figure 6:
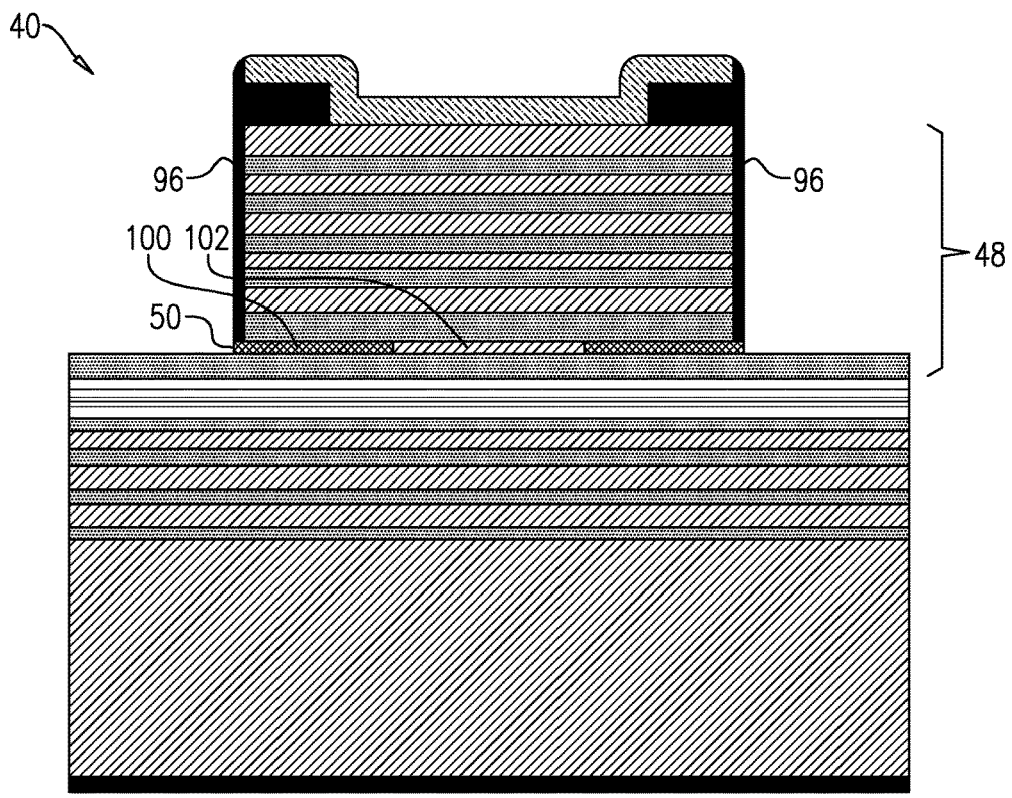
FIG. 6 is a schematic sectional illustration of a VCSEL after an oxidation step, in accordance with an embodiment of the invention.

FIG. 6 is a schematic sectional illustration of VCSEL after partial oxidation of confinement layer 50 in oxidation step 28. As explained above, step 28 is typically carried out inside an oxidation furnace (using $H_2O$ vapor, for example). As a result, a peripheral part 100, generally of annular shape extending in from mesa walls 86, has been oxidized in $Al_2O_3$, a dielectric material with a refractive index of 1.76. The remaining un-oxidized part of confinement layer 50 forms a central part 102. Central part 102 defines the optical aperture of VCSEL 40, which in turn defines the waist of the Gaussian beam emitted by VCSEL 40. Peripheral part 100 also constrains the current of VCSEL 40 into central part 102.

In the present example, confinement layer 50 comprises a layer with a very high Al-content, such as $Al_{0.98}Ga_{0.02}As$, with its thickness typically not exceeding 30 nm. As p-DBR stack 38 is protected by dielectric coating 96, the process point of the oxidation of confinement layer 50 at step 28 may be chosen optimally for the very high Al-content and very small thickness of the layer.

In an alternative embodiment, confinement layer 50 comprises a layer with a high Al-content, such as $Al_{0.90}Ga_{0.10}As$, and is up to 60 nm thick. This composition and thickness of confinement layer 50 will have the following advantages over those of a layer with a very high Al-content:

1. The variability of oxidation rate vs. variation of Al-content is lower for a high Al-content layer than for a very high Al-content layer. For instance, the ratio of the variability of oxidation rate vs. variation of Al-content is lower by a factor of two (22%/% Al vs. 45%/% Al) when comparing $Al_{0.90}Ga_{0.10}As$ to $Al_{0.98}Ga_{0.02}As$, as reported by Choquette et al., in "Advances in Selective Wet Oxidation of AlGaAs Alloys," *IEEE Journal of Selected Topics in Quantum Electronics* 3(3), pages 916-926, (1997);
2. The variability of oxidation rate vs. variation of confinement layer 50 thickness is lower for a high Al-content layer than for a very high Al-content layer. For instance, the ratio of the variability of oxidation rate vs. variation of layer thickness is lower by a factor of four (0.3 μm/nm vs. 1.2 μm/nm over a 35 minute oxidation) when comparing $Al_{0.93}Ga_{0.02}As$ to $Al_{0.93}Ga_{0.02}As$, as reported by Kim et al., in "Lateral wet oxidation of $Al_xGa_{1-x}GaAs$ depending on its structure," *Appl. Phys. Lett.* 69, pages 3357-3359 (1996).

The presence of dielectric coating 96 permits the process point to be chosen optimally for a high Al-content layer, such as $Al_{0.90}Ga_{0.10}As$, without concern for differential oxidation rates between $Al_{0.90}Ga_{0.10}As$ and the layers of p-DBR stack 48. This advantage is significant, since the chemical compositions of $Al_{0.90}Ga_{0.10}As$ and the layers of p-DBR stack 48 are close to each other.

The improved control of oxidation for both high and very high Al-content confinement layers in the present embodiments enables accurate control of the dimensions of the VCSEL optical aperture, leading to an increased yield of VCSELs within tight performance specifications. Although two specific examples of possible compositions of confinement layer 50 are described and analyzed above, other compositions, with other levels of aluminum concentration, as well as other layer thicknesses, may be used in this context, as will be apparent to those skilled in the art after reading the present description, and are considered to be within the scope of the present invention.

Figure 7:
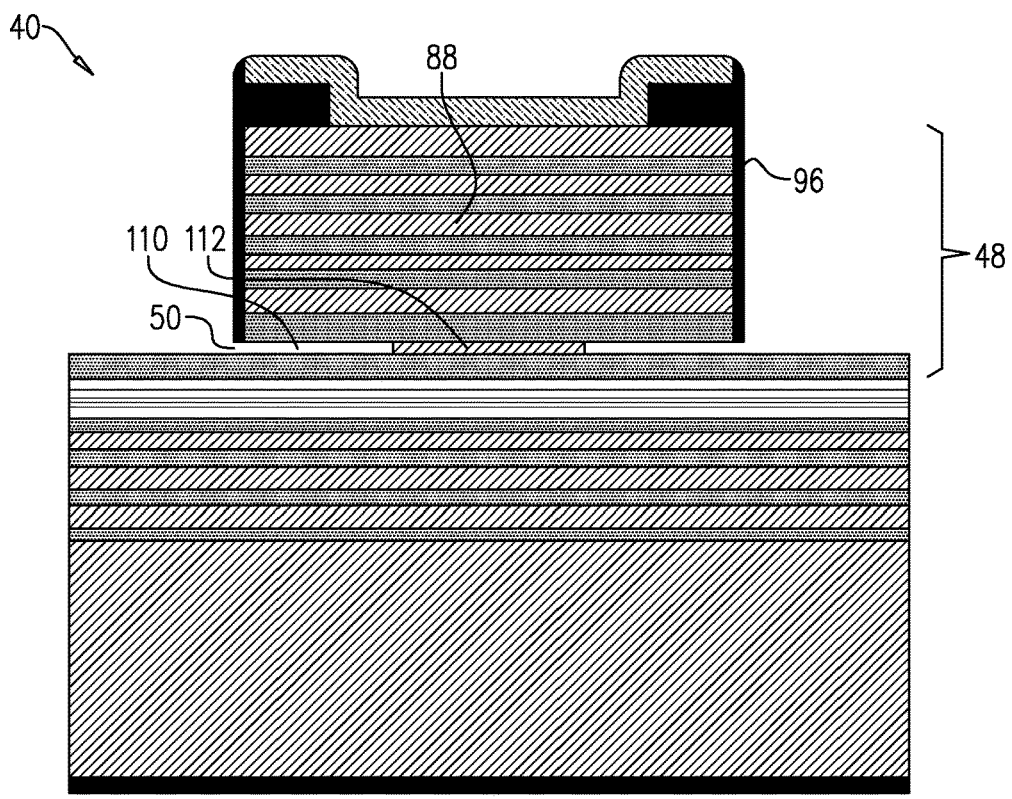
FIG. 7 is a schematic sectional illustration of a VCSEL after a cavity etch step, in accordance with an embodiment of the invention.

FIG. 7 is a schematic sectional illustration of VCSEL 40 after partial lateral etching of confinement layer 50 in cavity etch step 30. In this case, confinement layer 50 has been etched using a wet etch, typically comprising a citric acid and/or diluted hydrofluoric acid. The lateral wet etch has formed a peripheral part 110 as a cavity under mesa 88, with a central part 112 of confinement layer 50 left in place. (Peripheral part 110 is in general of annular shape under mesa 88). For Al-content exceeding 80%, wet lateral etching is expected to be less sensitive to the variations of Al-content than oxidation, as reported by Kumar et al., in "Sacrificial etching of $Al_xGa_{1-x}As$ for III-V MEMS surface micromachining," *Appl. Phys. A* 88, pages 711-714 (2007). Moreover, as per Kumar et al., the selectivity of the wet etch between confinement layer 50 and the low Al-content layers surrounding the confinement layer exceeds 10,000:1, assuring that only the confinement layer will be etched.

Figure 8:
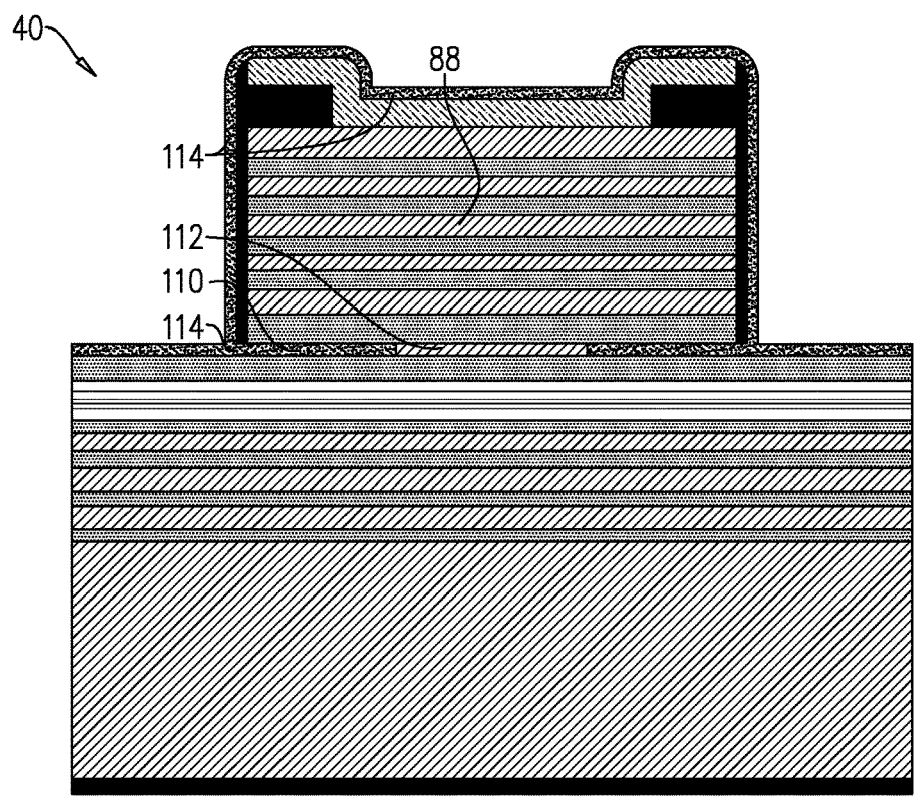
FIG. 8 is a schematic sectional illustration of a VCSEL after a cavity fill step, in accordance with an embodiment of the invention.

FIG. 8 is a schematic sectional illustration of VCSEL after cavity fill step 32, wherein a conformal dielectric coating 114 has been deposited on VCSEL 40. The material of dielectric coating 114 is chosen to have refractive index less than 1.6. A typical material is silicon dioxide ($SiO_2$), and a typical conformal deposition process is ALD. Due to the conformal deposition, dielectric material 114, besides covering VCSEL 40, also completely or partially fills the cavity of peripheral part 110 under mesa 88. Central part 112 is now responsible for both optical and electrical confinement within VCSEL 40. Due to the fact that the refractive index of the conformally deposited dielectric material is less than 1.6, the optical confinement is better than that achieved with the sort of $Al_2O_3$ confinement layer that is illustrated in FIG. 6.

Figure 9:
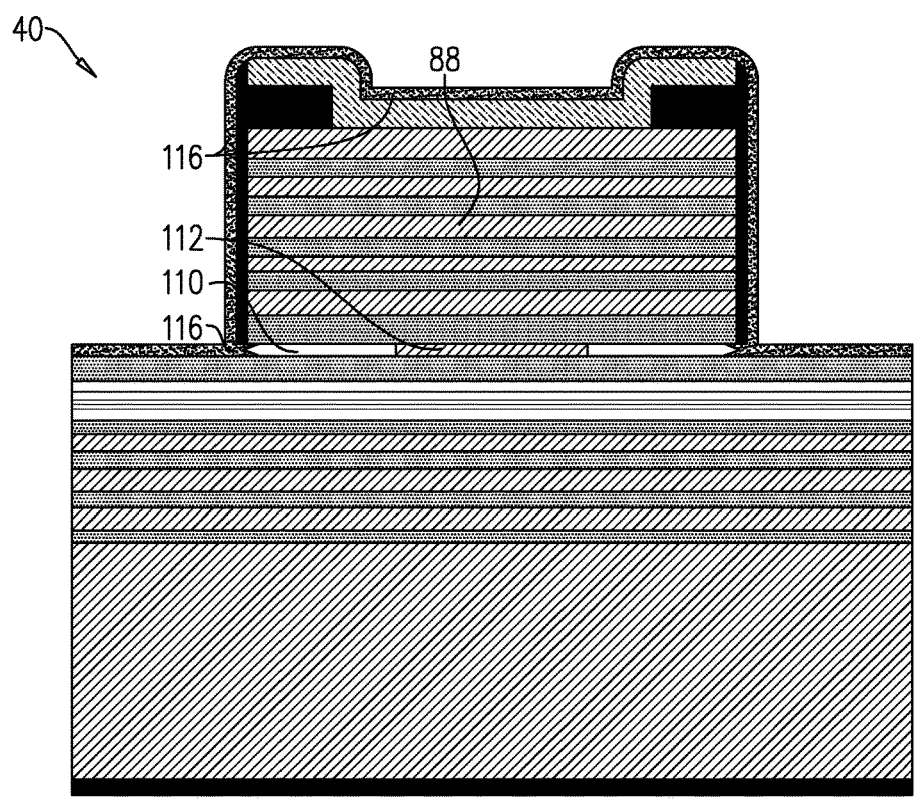
FIG. 9 is a schematic sectional illustration of a VCSEL after a cavity seal step, in accordance with an embodiment of the invention.

FIG. 9 is a schematic sectional illustration of VCSEL after cavity seal step 34, wherein a non-conformal dielectric coating 116, such as $SiO_2$ or $Si_3N_4$, has been deposited on VCSEL 40 using a process such as PECVD. As this deposition is non-conformal, dielectric material 116 has not penetrated the cavity of peripheral part 110 but rather sealed it around its edge, leaving the cavity intact under mesa 88 and filled with the low-pressure atmosphere (typically of the order of 0.001-1 Torr) that constitutes the ambient atmosphere during the non-conformal coating.

As described in the context of FIG. 8, central part 112 is again responsible for both optical and electrical confinement in VCSEL 40. However, now the refractive index of peripheral part 110 around central part 112 is that of a low-pressure atmosphere with a refractive index of 1.00, with even better optical confinement than that achieved with a solid dielectric fill illustrated in FIG. 8.

Figure 10:
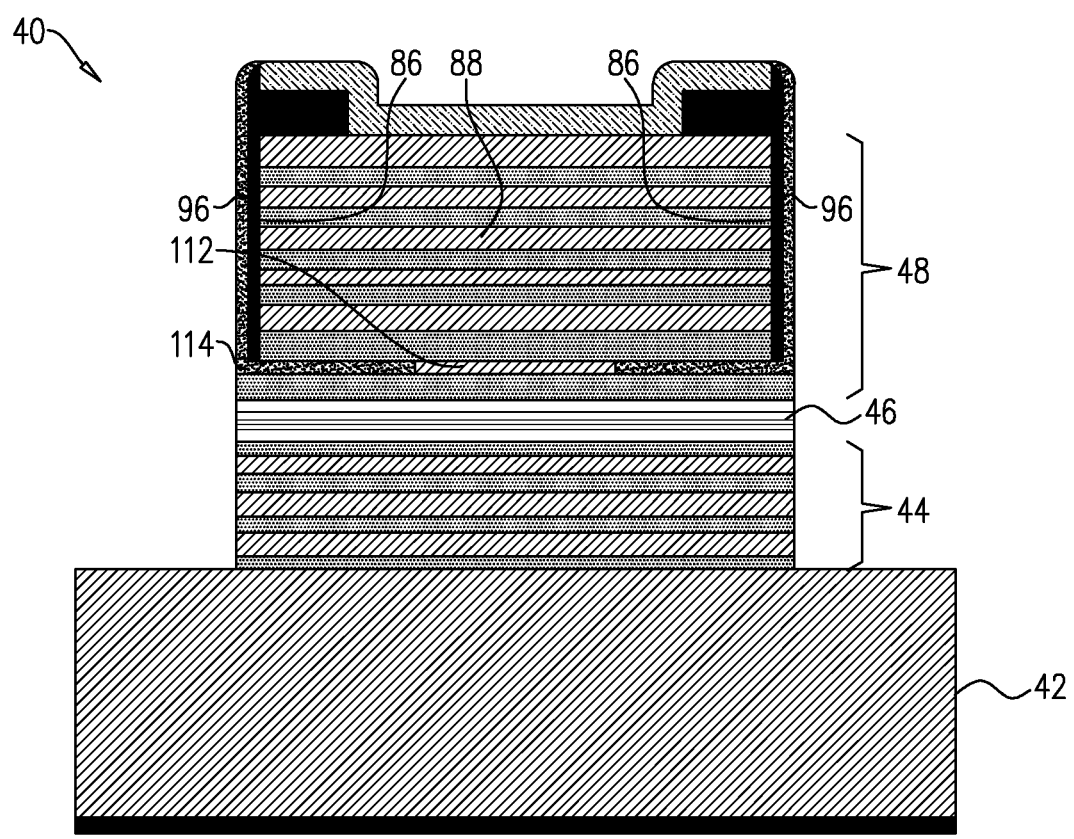
FIG. 10 is a schematic sectional illustration of a VCSEL after an n-DBR etch step in accordance with an embodiment of the invention.

FIG. 10 is a schematic sectional illustration of VCSEL 40 after n-DBR etch step 36. VCSEL 40 has been etched along walls 86 of mesa 88 down to substrate 42. Alternatively, n-DBR stack 44 may have been only partially etched, with the etch having been terminated before reaching substrate 42 (not shown in FIG. 10). In the etch process the previously remaining part of p-DBR stack 48 and QW stack 46 have also been etched, as well those horizontal parts of dielectric material 114 that were visible to the etch. Applying n-DBR etch step 36 alternatively after oxidation step 28 or cavity seal step 34 results in similar structures to those illustrated in FIG. 10, with minor differences that will be apparent to those skilled in the art.

Although the description above refers, for the sake of concreteness and clarity, to certain specific materials, compositions and process parameters, alternative implementations using variants of material, compositions and parameters will be apparent to those skilled in the art after reading the description and are considered to be within the scope of the present invention. It will thus be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. An optoelectronic device, comprising:
   a semiconductor substrate;
   a first set of epitaxial layers formed on an area of the substrate defining a lower distributed Bragg-reflector (DBR) stack;
   a second set of epitaxial layers formed over the first set, defining a quantum well structure;
   a third set of epitaxial layers, formed over the second set, defining an upper DBR stack,
   wherein at least the third set of epitaxial layers is contained in a mesa having sides that are perpendicular to the epitaxial layers;
   a confinement layer formed within the third set of epitaxial layers, the confinement layer comprising:
      a central part comprising a semiconducting material; and
      a peripheral part surrounding the central part and comprising a dielectric material;
   a dielectric coating extending over the sides of the mesa from an upper surface of the mesa and terminating at the confinement layer so as to cover all of the epitaxial layers that are above the confinement layer; and
   electrodes coupled to the epitaxial layers so as to apply an excitation current to the quantum well structure.

2. The optoelectronic device according to claim 1, wherein the dielectric coating does not extend over an upper surface of the mesa.

3. The optoelectronic device according to claim 1, wherein the semiconductor material comprises $Al_xGa_{1-x}As$, wherein x does not exceed 0.92.

4. The optoelectronic device according to claim 1, wherein the thickness of the confinement layer exceeds 50 nm.

5. The optoelectronic device according to claim 1, wherein the refractive index of the dielectric material does not exceed 1.6.

6. The optoelectronic device according to claim 1, wherein the dielectric material comprises silicon dioxide ($SiO_2$).

7. The optoelectronic device according to claim 1, wherein the peripheral part comprises a sealed cavity.

8. The optoelectronic device according to claim 1, wherein the dielectric material within the peripheral part of the confinement layer is a part of a conformal coating of the dielectric material that covers the sides of the mesa and extends into the peripheral part of the confinement layer.

9. A method for manufacturing an optoelectronic device, the method comprising: depositing a first set of epitaxial layers on an area of a semiconductor substrate to define a lower distributed Bragg-reflector (DBR) stack; depositing a second set of epitaxial layers over the first set, defining a quantum well structure; depositing a third set of epitaxial layers over the second set, defining an upper DBR stack, and including a confinement layer, comprising a semiconductor material, within the upper DBR stack; etching the third set of epitaxial layers to define a mesa having sides that are perpendicular to the epitaxial layers and extend from an upper surface of the upper DBR stack and terminate at the confinement layer; coating the sides of the mesa with a dielectric coating; after coating the sides of the mesa, processing the confinement layer so as to convert a peripheral part of the confinement layer to a dielectric material, while leaving the semiconductor material in a central part of the confinement layer, surrounded by the peripheral part; and coupling electrodes to the epitaxial layers so as to apply an excitation current to the quantum well structure; wherein the thickness of the confinement layer exceeds 50 nm.

* * * * *